United States Patent
Schoo et al.

[11] Patent Number: 6,099,980
[45] Date of Patent: Aug. 8, 2000

[54] ORGANIC ELECTROLUMINESCENT DEVICE

[75] Inventors: Hermannus F. M. Schoo; Robert J. C. E. Demandt, both of Eindhoven, Netherlands

[73] Assignee: U.S. Philips Corporation, New York, N.Y.

[21] Appl. No.: 08/914,057

[22] Filed: Jul. 15, 1997

[30] Foreign Application Priority Data

Jul. 16, 1996 [EP] European Pat. Off. ............. 96202013

[51] Int. Cl.[7] .............................. H05B 33/14; B05D 3/10; B05D 5/06
[52] U.S. Cl. ..................... 428/690; 428/195; 428/917; 313/504; 313/506; 257/40; 257/88; 427/66; 427/337
[58] Field of Search ................... 428/690, 917, 428/411.1, 457, 195, 212; 313/504, 506, 510, 500; 257/40, 88, 102, 103; 427/66, 68, 272, 273, 282, 337

[56] References Cited

U.S. PATENT DOCUMENTS

| | | | |
|---|---|---|---|
| 5,444,330 | 8/1995 | Leventis et al. | 313/506 |
| 5,677,546 | 10/1997 | Yu | 257/40 |
| 5,682,043 | 10/1997 | Pei et al. | 257/40 |
| 5,767,624 | 6/1998 | Gordon, II et al. | 313/509 |

OTHER PUBLICATIONS

Pei et al., "Polymer Light–Emitting Electrochemical Cells", *Science*, vol. 269, pp. 1086–1088, Aug. 25, 1995.

Netherlands Patent No. NL 1002944 (PHN 15.772), publication date not given.

*Primary Examiner*—Marie Yamnitzky
*Attorney, Agent, or Firm*—John C. Fox

[57] ABSTRACT

An organic electroluminescent device and a method of manufacturing such a device. By patterned exposure of an alkylatable-compound-containing organic layer of the device to an alkylating agent, a device is obtained which, in operation, exhibits patterned light emission, without it being necessary to structure the electrode layers. A salt is locally formed by means of alkylating in accordance with a pattern. If the salt contains ions which can move under the influence of an electric field, the threshold voltage necessary to produce light emission is reduced.

9 Claims, 1 Drawing Sheet

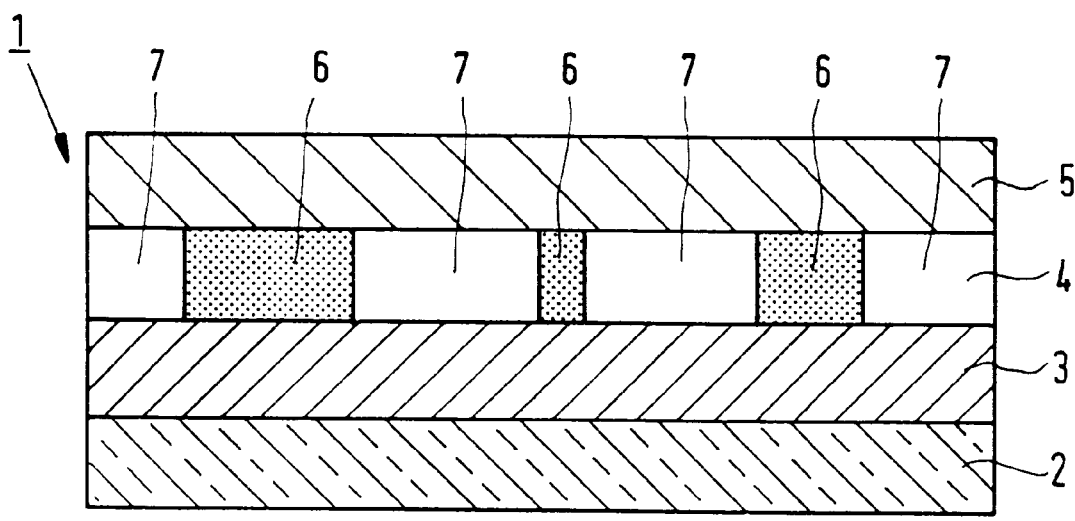

ously bonded. The
ORGANIC ELECTROLUMINESCENT DEVICE

BACKGROUND OF THE INVENTION

The invention relates to an electroluminescent device comprising a first electrode, a second electrode and an ionic organic layer which is in contact with said second electrode, which layer contains a conjugated compound and a salt, at least an anion or cation of said salt being mobile relative to the second electrode.

The invention also relates to a method of manufacturing such an electroluminescent device.

An electroluminescent (EL) device is a device which, utilizing the phenomenon referred to as electroluminescence, emits light when the device is suitably connected to an electric power source. If the light emission originates in an organic material, the device in question is referred to as an organic electroluminescent device.

An organic EL device can be used, inter alia, as a thin light source having a large light-emitting surface, such as a backlight for a liquid-crystal display or an illuminated logo. An organic EL device can also be used as a "display" if the EL device comprises a number of EL elements, which are or are not independently addressable. Integrated EL elements can be obtained, for example, by providing both sides of an electroluminescent layer with a patterned electrode layer.

The EL device is provided with at least two electrodes which are in contact with the organic EL layer. By applying a suitable voltage, the negative electrode, i.e. the cathode, will inject electrons and the positive electrode, i.e. the anode, will inject holes. The cathode and the anode may be coplanar, however, it is more customary to arrange them one above the other in such a way that the EL layer is sandwiched between them. In the latter case, at least one of the electrodes should be transparent to the light to be emitted. A known transparent electrode material for the anode is, for example, indium tin oxide (ITO). Apart from the EL layer, known organic EL devices generally comprise additional organic layers to enhance the charge injection and/or charge transport.

An EL device of the type mentioned in the opening paragraph is described in the non-prepublished Dutch Patent Application NL 1002944 published as international application WO 97/40648 Oct. 30, 1997 (corresponding to U.S. application Ser. No. 08/842,525, filed Apr. 24, 1997), which is in the name of the current Applicant. In said Application, a description is given of an EL device which is composed of a stack of layers comprising, in succession, an ITO electrode layer, an ionic organic layer and an indium electrode layer. The ionic layer contains a poly(phenylene vinylene) to which a quaternary amino group is covalently bonded. The counterion of the quaternary amino group is mobile. By virtue of the presence of mobile ions, which can move relative to the electrodes under the influence of an electric field, the voltage necessary to attain light emission is much lower than the voltage necessary for light emission in a corresponding EL device which does not contain such mobile ions.

The ionic organic layer containing the quaternary amine can be obtained by exposing a precursor layer containing the corresponding tertiary amine to an alkylating agent. As regards the other process steps in the manufacture of the EL device, said Application teaches that techniques which are known per se are suitable. Said Patent Application does not state how a patterned light-emitting surface is to be manufactured. According to said Patent Application, individual EL elements can be obtained by using a structured electrode layer. However, it is necessary to avoid the formation of EL elements at locations where they are undesirable, as would be the case, for example, if an electric power supply line of a positive electrode of an EL element overlaps an electric power supply line of a negative electrode of another EL element, while they are both energized at the same time. The necessity of avoiding such undesirable EL elements restricts the designer's freedom to realize a desirable pattern.

OBJECTS AND SUMMARY OF THE INVENTION

It is an object of the invention to provide, inter alia, an EL device which, in operation, exhibits a light-emitting surface in accordance with a desirable pattern. The invention more particularly aims at providing an EL device which, in operation, exhibits a light-emitting pattern without it being necessary to structure an electrode. In addition, the designer will have been allowed a lot of freedom with respect to the design of the desired pattern. Besides, the number of individual electrodes and associated power supply lines should be as small as possible, given the number of EL elements desired. A further object of the invention is to provide a simple method of manufacturing such a device.

This object is achieved by an EL device of the type mentioned in the opening paragraph, wherein the ionic layer comprises a salt which is converted from a salt precursor in accordance with a pattern, while forming light-emitting regions.

In the above-mentioned, non-prepublished Patent Application NL 1002944, it is stated that the presence of mobile ions in the organic EL layer of an EL device causes the minimum voltage required to produce light emission, i.e. the threshold voltage, to be reduced considerably. The patterned conversion of the salt precursor into the salt leads to the formation of an ionic layer which is subdivided into regions in which salt is formed and regions in which no salt is formed. If the salt contains mobile ions, the subdivision corresponds to regions having a low and a high threshold voltage. In customary operating conditions, in which the operating voltage is chosen to range between the low and the high threshold voltage, only regions having the low threshold voltage will emit light. In this manner, for example, a luminous logo can be obtained without the electrodes having been structured. Undesirable luminescence of areas where a positive and a negative power supply line of different EL elements cross each other can be precluded in a simple manner. Moreover, in the case of a "display" in which independently addressable EL elements are to be accommodated, only one structured electrode is sufficient.

In accordance with the invention, the salt precursor is locally converted into a salt. Salt precursors as well as the ion-forming chemical reactions by means of which they are converted into the corresponding salt are known per se. Suitable salt precursors are, for example, alcohols which can be oxidized into carboxylates or anhydrides which can be hydrolyzed into carboxylates. Photochemical acid-forming agents can also suitably be used.

In a preferred embodiment in accordance with the invention, the salt precursor is a compound which can be alkylated, and the salt is an alkylated compound. The conversion of alkylatable compounds into salts in the form of alkylated compounds is very simple and, unlike many organo-chemical reactions, it hardly requires any aftertreatment.

An alkylatable compound can be converted into an alkylated ionogenic compound, i.e. a salt, by means of an alkylating agent. The alkylatable compound becomes a constituent of the cation. For example, trimethylamine can be alkylated by means of methyl iodide, thereby forming the alkylated compound tetramethyl ammonium iodide.

Depending on the choice of the alkylating agent and the reaction conditions, a wide range of compounds can be alkylated. Compounds which are particularly suitable are those which contain a sulphur atom or nitrogen atom which is provided with a lone-pair. Particularly suitable alkylatable compounds are tertiary amines, inclusive of aromatic amines such as pyridines, because they give rise to very stable alkylated compounds, i.e. the quaternary amines.

The salt formed by alkylating leads to a reduction of the threshold voltage if said salt contains mobile ions. The mobility of ions is governed, inter alia, by the temperature and the matrix in which they are situated. For example, the mobility can be increased by means of gelling by adding a suitable solvent and/or heating. Another important factor is the size of the ion and the strength of the bond between oppositely charged ions. Preferably, a mobile ion is small, yet soft. The mobility of a mobile ion should be as high as possible. Depending on the applications, a suitable mobility for a mobile ion is $10^{-14}$ cm$^2$/Vs or higher. The ions should be chemically inert, in particular, under the operating conditions of the device.

Suitable mobile anions are ions derived, for example, from Bronsted-acids, such as halogenides, in particular I$^-$, tosylates, triflates, carboxylates or Lewis-acid anions, such as $BF^-_4$. Suitable mobile cations, which can be obtained from alkylatable compounds, are, for example, quaternary amines, such as tetra-alkyl ammonium compounds. Cations which are particularly suitable are those in accordance with the formula $N(R)^+_4$, wherein each R is equal to or different from a branched or unbranched $C_1$–$C_4$ alkyl group.

The ionic layer is only suitable for use in an EL device if there is also a conjugated compound which transports the injected charges. If a single-layer device is used, in addition, a conjugated compound having an EL property in the ionic layer is required, which compound is generally identical to the charge-transporting compound. Suitable, known charge-transporting, EL compounds are, for example, low-molecular fluorescent dyes, such as in particular coumarins, EL polymers, such as in particular poly-phenylene vinylenes or high-molecular or low-molecular derivatives of phenyl-biphenyl-1,3,4-oxadiazole or triphenylamine dimer or poly-vinyl carbazole. It is necessary, however, that the salt should leave the charge-transporting and/or electroluminescent properties of the layer, obtained by using the conjugated compound, substantially unchanged. This requirement will be met if the ionogenic compound has a much greater bandgap and ionization potential and a much smaller electron affinity than the conjugated compound.

The ionic layer can be manufactured by methods which are known per se. Typical layer thicknesses range from 10 to 500 nm, in particular from 50 to 150 nm.

It has been found that materials having a high work function can suitably be used as the cathode material. In fact, the EL efficiency proves to be substantially independent of the cathode material used. Examples of suitable cathode materials are gold, platinum and other noble metals, aluminum, indium tin oxide. These electrode materials are not subject to degradation during operation of the EL device under ambient conditions.

Use can advantageously be made of metals which are provided in liquid form, such as indium as the anode and/or cathode material. Said metals can be provided in a simple manner and a resultant electrode proves to be non-porous. The absence of porosity has a favorable effect on the service life.

Said cathode materials can also suitably be used as anode materials. If the EL device has a "sandwich" structure, it is advantageous to use an electrode material which is transparent to the light to be emitted, such as an indium tin oxide (ITO).

It has been found that the time-dependence of the current/voltage characteristic (I-V) and of the luminance/voltage (L-V) characteristic of the EL device in accordance with the invention correspond to those of EL devices described in the above-mentioned non-prepublished Dutch Patent Application.

If both the cation and the anion of the salt are mobile, there is a risk that the initially provided pattern will be erased by lateral diffusion of the mobile ions. In view of the foregoing, in a preferred embodiment of the EL device in accordance with the invention, only one anion or only one cation of the salt is mobile relative to the second electrode. The presence of mobile ions compensated by immobile ions creates a "restoring force" if said mobile ions have been displaced under the influence of an electric field or diffusion, as a result of which the pattern provided will be preserved. If the salt is present in the form of an alkylated compound, the immobile ion will be a cation. Immobile ions can be obtained by using a large ion. The mobility of a suitable immobile ion is approximately $10^{-19}$ cm$^2$/Vs or less. The immobile ions should be chemically inert, in particular under the operating conditions of the device.

It has been found that the service life of the device in accordance with the invention can be improved even further by using an additional layer. In view of this, in a preferred embodiment of the EL device according to the invention, said device comprises an additional layer, which layer is situated between the first electrode and the ionic layer and contains a conjugated compound as well as such a quantity of mobile ions that the overall charge of these mobile ions is substantially compensated by immobile ions of the ionic layer. It is noted that the qualification "ionic layer" only makes sense in multilayer devices if immobile ions are used, which are substantially absent in the additional layer. Unlike known multilayer devices, the resultant freedom of design does not have to be sacrificed to the adaptation of the electron affinity and the ionization potential of the relevant materials to the work function of the electrodes, as electrode-independence is guaranteed substantially by the presence of the ions. Both the additional layer and the ionic layer can be used as an EL and/or charge-transporting layer.

Suitable materials for the additional layer are the known EL and charge-transporting materials, such as a poly (phenylene vinylene). It is alternatively possible to use various additional layers, but this leads to a greater complexity of the EL device. In a particularly suitable configuration, the ionic layer is situated between the additional layer and the negative electrode as, in general, particularly the injection and/or transport of electrons has to be improved.

In a particular, preferred embodiment of the EL device in accordance with the invention, the ionic layer and the additional layer have substantially identical fluorescence spectra, ionization potentials and electron affinities. As the difference between the ionic layer and the additional layer consists merely in the presence and absence, respectively, of immobile ions, the conjugated parts can be selected so that the above characteristic is satisfied. This is in contrast to known multilayer devices in which a plurality of layers are used to create differences in ionization potential, electron affinity or fluorescence spectrum. The EL device in accordance with the invention combines the advantages of mono-layer and multilayer devices. Such a device can be manufactured in a simple manner by successively providing the two layers or by using a method which will be described in greater detail hereinbelow.

In another preferred embodiment of the EL device in accordance with the invention, an immobile ion is formed by a charged substituent which is linked to the conjugated compound by means of a covalent, saturated bond. By means of organic synthesis, a conjugated compound can be provided with an alkylatable group. In this case, the conjugated compound and the alkylatable compound form, in fact, one and the same compound. If this compound is alkylated, the conjugated compound comprises a charged substituent. The size of the conjugated compound causes the ion formed by this substituent to be immobile. This has the advantage that the layer from which the ionic layer is formed only has to comprise one compound. By virtue thereof, phase-separation, which is a problem which arises often when different compounds are mixed, is precluded. By linking the substituent by means of a covalent, saturated bond, the ionogenic property and the conjugated property can be introduced with a minimum of mutual interference. Therefore, suitable compounds can be obtained in a simple manner by combining suitable conjugated and ionogenic compounds.

In a particularly, preferred embodiment of the EL device in accordance with the invention, an immobile ion of the ionic layer is formed by a polymer. The use of polymeric materials has advantages. The high molecular weight ensures that the ionogenic portions which form part of the polymer are indeed immobile. Further, polymers are, in general, readily processable, amorphous and suitable for producing flexible devices having large surface areas by using simple techniques such as spin coating. Suitable alkylatable polymers form high-molecular analogues of alkylatable compounds mentioned hereinbefore. To ensure that mixing takes place on a molecular scale, it is of course again possible to combine the ionic property and the conjugated property in one compound. In the case of polymers, this is very advantageous. The mixing of two polymers will almost always give rise to phase-separation if no special measures, such as the addition of "compatibilizers", are taken.

In a particularly suitable embodiment of the EL device in accordance with the invention, the ionic layer comprises a conjugated poly(p-phenylene vinylene). Poly-p-phenylene vinylenes are very suitable EL materials. They exhibit a high degree of fluorescence and a satisfactory electroconductivity. The emission spectrum can be varied and readily soluble and processable variants can be obtained by means of substitution, in particular, in positions 2 and 5.

In a very suitable, preferred embodiment of the EL device in accordance with the invention, the ionic layer comprises a copolymer in accordance with formula (IA), (IB) or (II)

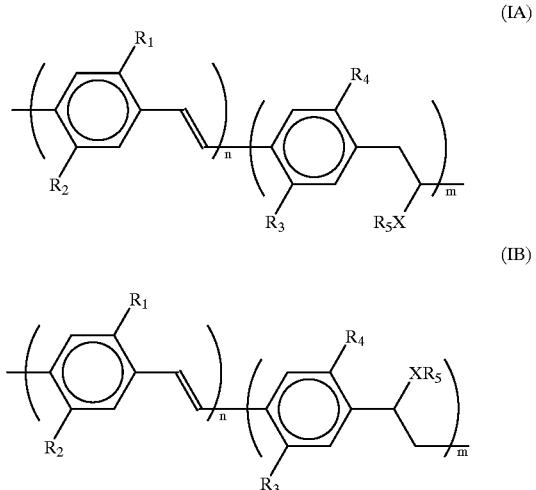

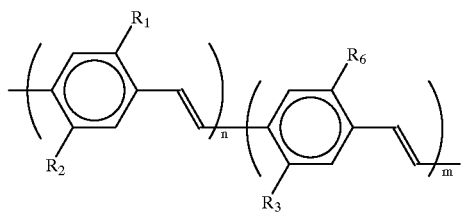

wherein the degree of polymerization n+m varies from 5 to 1,000,000, $R_1$, $R_2$, $R_3$, $R_4$ are independently chosen as —X—R—H or —R—H, $R_5$ is —R—$K_1A_1$ and $R_6$ is equal to $R_5$ or to —X—$R_5$, wherein R is a branched or unbranched $C_1$–$C_{20}$ alkylene or phenylene-alkylene, X is sulphur or oxygen, $K_1$ is an ammonium group, $A_1$ is equal to I$^-$, tosylate or another Bronsted-acid anion. Said copolymers are alkylated compounds, the synthesis of which is described in the above-mentioned non-prepublished Dutch Patent Application, and they are soluble and can be readily processed to form amorphous layers in which, after alkylation, the ions are dispersed on a molecular scale. Preferably, the fraction m/(n+m) in polymers in accordance with formula (IA) or (IB) is below 0.15 and above 0.001. Higher values cause the service life to be shortened as a result of an interruption of the conjugation, whereas lower values require an ever longer activation time. In the case of polymers in accordance with formula (II), the fraction m/(n+m) can be varied between 0 and 1, preferably, the fraction is greater than 0.001 and smaller than 0.1. The smaller the fraction, the longer the necessary activation time is. At values above 0.1, a substantial reduction of the activation time is no longer achieved. It has been found that the service life of EL devices prepared by means of polymers (II) is better than that of comparable devices prepared by means of polymers in accordance with formula (IA) or (IB). It has also been found that, under otherwise unchanged conditions, also the voltage necessary to attain a specific current intensity is lower than in devices based on polymers in accordance with formula (II). If polymers in accordance with formula (II) are used, the device can even be operated in air saturated with water vapor for several days.

The presence of non-ionic substituents promotes the solubility. With a view thereto, it is advantageous to choose substituents of unequal length and/or branched substituents. The use of alkylene substituents longer than $C_{20}$ hardly leads to a further increase in solubility, whereas the quantity of active material is reduced. The solubility is also determined by the nature of the mobile counterion. For example, polymers in which the tosylate ion is used as the counterion can be dissolved more readily in toluene than the same polymer in which iodide is used as the counterion.

A very advantageous embodiment relates to the use of a copolymer in accordance with formula (II), in which the degree of polymerization n+m varies from 5 to 1,000,000, $R_1$ is methoxy, $R_2$ is 3,7-dimethyloctyloxy, $R_3$ is methoxy and $R_6$ is [—$CH_2CH_2N(CH_3)_3$]$^+$I$^-$.

The object of providing a method for the manufacture of an EL device in accordance with the invention is achieved by a method in which a first electrode is provided with a precursor layer which contains a salt precursor, whereafter said salt precursor is exposed to an agent, thereby forming a salt, which leads to the formation of an ionic layer from the precursor layer, and, subsequently, a second electrode is provided on the ionic layer, the precursor layer being exposed to the agent in accordance with a pattern. An advantage of the method in accordance with the invention is its simplicity: apart from the patterned exposure to the alkylating agent, no further structuring steps are necessary to manufacture an EL device which, in operation, exhibits a desired light-emitting pattern. A further advantage of this method is that the ions are not introduced until after the morphology of the layer has been fixed, so that phase-separation, which could occur due to the presence of ions, is precluded. A further advantage is that a multilayer device can be formed in a simple manner from a single-layer device by exposing the precursor layer to said agent for a period of time which is shorter than that necessary for complete conversion of the salt precursor, so that the ionic layer and the additional layer are concurrently formed from the precursor layer. The transition from the ionic layer to the non-ionic, additional layer is defined by the diffusion profile of the agent and will be governed by the selected process conditions. Salt precursors as well as the ion-forming chemical reactions by means of which they are converted to the corresponding salt are known per se. Suitable salt precursors are, for example, alcohols or aldehydes which can be oxidized into carboxylates, using, for example, chromate as the agent, or anhydrides which can be hydrolyzed into carboxylates using aqueous bases as the agent. Photochemical acid-forming agents can also suitably be used.

The patterned conversion of a salt precursor into a salt can be carried out by means of techniques which are known per se. For example, a stencil or a die, in which the desired pattern is provided, can be used to bring the alkylating agent into contact with the precursor layer, while using a solvent, if necessary. Other suitable techniques are, for example, tampon printing, ink-jet printing or screen printing.

In a preferred embodiment in accordance with the invention, the salt precursor is an alkylatable compound, the salt is an alkylated compound and the agent is an alkylated agent. The conversion of alkylatable compounds into salts in the form of alkylated compounds is very simple and, unlike many organo-chemical reactions, aftertreatments are hardly required. Alkylating agents are known per se. They are often derived from Bronsted acids in which the acid protons are replaced, for example, by an alkyl group. Examples of such alkylating agents are dialkyl sulphates, alkyl halides and alkyl tosylates. The alkylating agent should be selected so that undesirable side reactions do not occur. Suitable alkylating agents for amines are, for example, alkyl halides and alkyl tosylates. If the compound to be alkylated is so large that the resultant ion formed by alkylating is immobile, the required mobile ion should be supplied by the alkylating agent. Alkyl halides and alkyl tosylates supply such a mobile ion. The other process steps necessary to produce the EL device in accordance with the invention can be carried out by means of known techniques. The negative electrode is preferably manufactured by providing molten indium on the organic layer or layers.

These and other aspects of the invention will be apparent from and elucidated with reference to the embodiments described hereinafter.

BRIEF DESCRIPTION OF THE DRAWINGS

In the drawing:

The sole FIGURE is a schematic, cross-sectional view, not to scale, of an EL device in accordance with the invention.

DESCRIPTION OF THE PREFERRED EMBODIMENTS

EXAMPLE 1

FIG. 1 shows, schematically and not to scale, a cross-sectional view of an EL device 1 in accordance with the invention. The device was manufactured as follows. An 1 mm thick glass substrate 2 of 2.0 by 1.5 cm carrying a 150 nm thick layer of indium tin oxide 3, whose surface resistance is less than 20 $\Omega/\square$, is cleaned with, in succession, soap, water and isopropanol, and then provided, by means of spin coating from a 1 wt. % solution in THF/toluene (1:3), with a 200 nm thick precursor layer of a polymer in accordance with formula (IA) or (IB), wherein $R_1$ and $R_3$ are 3,7-dimethyloctyloxy, $R_2$ and $R_4$ are methoxy, $R_5$ is —$CH_2CH_2N(CH_3)_2$, m/(m+n) is 0.08. The preparation of the polymer is described in the above-mentioned, non-prepublished Dutch Patent Application. The precursor layer photoluminesces orange light, is amorphous and non-scattering. Subsequently, a 10 wt. % solution of the alkylating agent ethyl-p-toluene sulphonate (ethyl tosylate) in acetone is locally provided, by means of a brush, on the precursor layer in accordance with a desired line pattern. After evaporation of the acetone, the alkylating agent is allowed to act for 30 minutes, thereby forming alkylated regions 6 and non-alkylated regions 7 in the ionic layer 4 thus formed. In the alkylated regions, the group $R_5$ is converted into —$CH_2CH_2N(CH_3)_2CH_2CH_3$ $^+Tos^-$. The tosylate anion $Tos^-$ serves as a mobile ion. Subsequently, the ionic layer is rinsed with hexane, dried and provided with an electrode 5 by applying a drop of molten indium onto the ionic layer, which drop covers at least the alkylated regions. The electrodes 3 and 5 of a device manufactured as described hereinbefore are connected to a voltage source. If a voltage of 15 V is applied, the indium electrode 5 serving as the negative electrode, then only the alkylated regions 6 exhibit light emission, so that the line pattern provided becomes visible. Initially, the luminance increases with time, but after an activation time of two minutes it reaches a substantially constant value. Also after the voltage has been reduced to 5 V, the alkylated regions 6 keep emitting light, the luminance being approximately 50 $Cd/m^2$.

What is claimed is:

1. An electroluminescent device comprising a first electrode, a second electrode and an ionic organic layer which is in contact with the second electrode, which ionic organic layer contains a conjugated compound, a salt having an anion or a cation that is mobile relative to the second electrode and having at least one ion that is immobile relative to said second electrode, and a salt precursor convertible into said salt in accordance with a pattern to form light-emitting regions, said salt being formed by pattern-wise conversion of said salt precursor to form light-emitting areas containing said salt.

2. An electroluminescent device as claimed in claim 1, wherein the salt precursor is a compound which can be alkylated, and the salt is an alkylated compound.

3. An electroluminescent device as claimed in claim 1, wherein the device comprises an additional layer, which additional layer is situated between the first electrode and the ionic layer and contains a conjugated compound as well as such a quantity of mobile ions that the overall charge of these mobile ions is compensated by immobile ions of the ionic layer.

4. An electroluminescent device as claimed in claim 1, wherein the immobile ion is formed by a charged substituent which is linked to the conjugated compound by means of a covalent, saturated bond.

5. An electroluminescent device as claimed in claim 1, wherein the immobile ion of the ionic layer is formed by a polymer.

6. An electroluminescent device as claimed in claim 1, wherein the ionic layer comprises a conjugated poly(p-phenylene vinylene).

7. An electroluminescent device in accordance with claim 6, wherein the ionic layer comprises a copolymer in accordance with formula (IA), (IB) or (II)

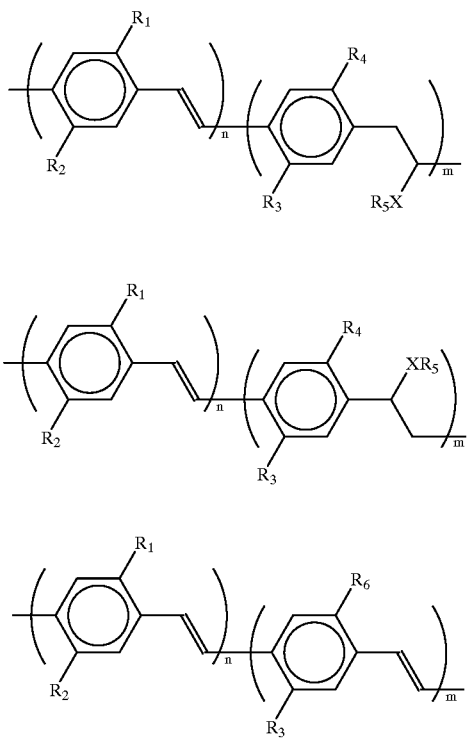

wherein the degree of polymerization n+m varies from 5 to 1,000,000, $R_1$, $R_2$, $R_3$ and $R_4$ are independently chosen as —X—R—H or —R—H, $R_5$ is —R—$K_1A_1$ and $R_6$ is equal to $R_5$ or to —X—$R_5$ wherein R is a branched or unbranched $C_1$–$C_{20}$ alkylene or phenylene-alkylene, X is oxygen or sulfur, $K_1$ is an ammonium group, $A_1$ is an $I^-$, tosylate or another Bronsted-acid anion.

8. A method of manufacturing an electroluminescent device of claim 1, which method comprises: providing a first electrode with a precursor layer, said precursor layer containing a conjugated compound and a salt precursor capable of being converted to a salt having an anion or a cation that is mobile relative to a second electrode and having an ion that is immobile relative to said second electrode, exposing said precursor layer to an agent which converts said salt precursor to said salt, in accordance with a pattern, to form a patterned layer of an ionic organic layer and then providing said second electrode on said patterned layer.

9. A method of manufacturing an electroluminescent device as claimed in claim 8, wherein the salt precursor is an alkylatable compound, the salt is an alkylated compound and the agent is an alkylating agent.

* * * * *